United States Patent [19]

Coquin et al.

[11] 3,892,973

[45] July 1, 1975

[54] MASK STRUCTURE FOR X-RAY LITHOGRAPHY

[75] Inventors: Gerald Allan Coquin; Juan Ramon Maldonado, both of Berkeley Heights; Dan Maydan, Short Hills, all of N.J.

[73] Assignee: Bell Telephone Laboratories, Incorporated, Murray Hill, N.J.

[22] Filed: Feb. 15, 1974

[21] Appl. No.: 442,921

[52] U.S. Cl. .................... 250/505; 29/579; 250/514

[51] Int. Cl. .......................... G01n 21/34

[58] Field of Search ........... 250/320, 505, 510, 514; 29/578, 579; 96/38.4, 36.2; 156/16

[56] References Cited

UNITED STATES PATENTS 3,743,842 7/1973 Smith et al.......................... 250/320

*Primary Examiner*—James W. Lawrence

*Assistant Examiner*—Davis L. Willis

*Attorney, Agent, or Firm*—L. C. Canepa

[57] ABSTRACT

A mask structure for use in an x-ray lithographic system comprises as the substrate thereof a Mylar film stretched over and bonded to a support ring. The stretched Mylar film exhibits an attractive combination of advantageous properties such as high planarity, dimensional stability, mechanical strength, low x-ray absorption, resistance to organic solvents, optical transparency, and ready availability in a variety of thicknesses with optical quality surfaces.

9 Claims, 5 Drawing Figures

(PRIOR ART)

MASK STRUCTURE FOR X-RAY LITHOGRAPHY

BACKGROUND OF THE INVENTION

This invention relates to the fabrication of micro-miniature devices and more particularly to a mask structure for use in an x-ray lithographic system.

By utilizing conventional photolithographic techniques, it is possible to fabricate micro-miniature electronic devices. The resolution capabilities of such standard techniques are limited by interference and diffraction effects that are directly related to the wavelength of the light employed in photolithography. In practice, the minimum line width which can be accurately replicated by conventional photolithographic printing is about 1-2 $\mu$m. Moreover, to achieve such resolution, intimate mask-to-wafer contact is required, which in time typically results in physical damage to the mask and/or wafer.

It has been demonstrated that higher resolution (sub-micron) pattern definition in device fabrication can be achieved with scanning electron beam lithography. But it appears that a fully versatile electron beam exposure system will be an expensive and complex installation. In addition, in such a system it is necessary that each pattern of each device be exposed in a sequential point-by-point manner under control of a programming system. Such a procedure is relatively time-consuming and expensive.

Accordingly, it has been proposed that a scanning electron beam be used only to generate high-resolution master masks. Replication of the mask patterns onto wafers would then be done in some other way. Electron beam projection systems have been suggested to carry out such replication but indications are that such systems will also be complex and expensive.

In U.S. Pat. Nos. 3,742,229, 3,742,230, and 3,743,842 an x-ray lithographic process suitable for replication of sub-micron-feature patterns is described. In accordance with that process, soft x-rays are utilized to achieve printing in parallel of a mask pattern. The described process is analogous to conventional photolithographic contact printing but has the added advantage that a finite mask-to-wafer separation is permitted.

One of the keys to the realization of a commercially feasible high-resolution x-ray lithographic system is the construction of a suitable master mask. Various materials have been suggested for the mask substrate, which must be relatively transmissive to x-rays. One such material is beryllium, which is characterized by low x-ray absorption but which is expensive, optically opaque (which makes alignment and registration difficult), and toxic. In addition, silicon structures having thin x-ray transparent windows have been fabricated, but such structures are relatively fragile and optically transparent only to a partial extent.

SUMMARY OF THE INVENTION

An object of the present invention is to improve x-ray lithography.

More specifically, an object of this invention is an improved mask structure for use in an x-ray lithographic system.

Briefly, these and other objects of the present invention are realized in a specific illustrative embodiment thereof that comprises as a mask substrate a thin sheet of Mylar polyester film. (Mylar is a registered trademark of E. I. DuPont de Nemours and Co.) The film is stretched over and bonded to a support member. The supported film constitutes a highly planar and durable substrate that is as dimensionally stable as the support member itself.

By conventional techniques an x-ray-absorptive pattern is formed on the stretched substrate. The resulting master mask structure is positioned close to a wafer coated with an x-ray-sensitive layer. By illuminating the mask with x-rays, a shadow of the pattern defined by the x-ray-absorptive material is projected onto the sensitive layer. In this way sub-micron features may be defined on the wafer in a relatively fast and inexpensive manner.

DETAILED DESCRIPTION

Figure 1:
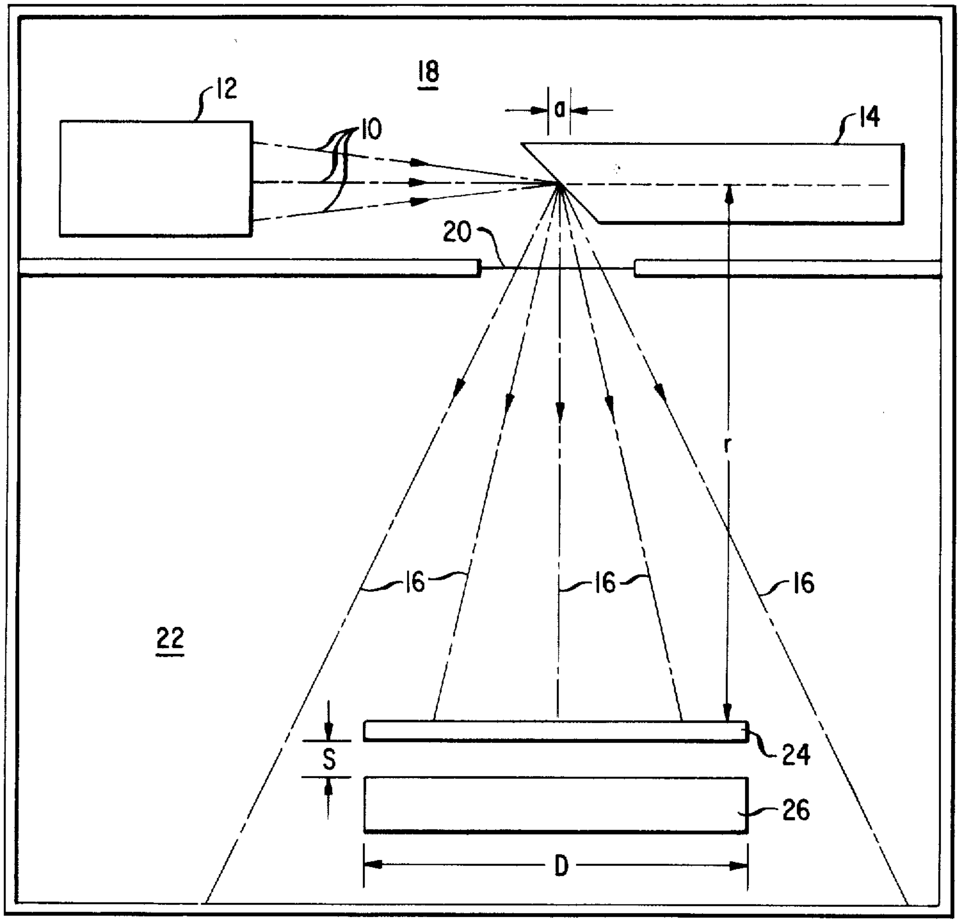
FIG. 1 is a schematic depiction of a prior art x-ray lithographic system.

A simplified depiction of a conventional x-ray lithographic system is shown in FIG. 1. A beam of electrons (indicated by dashed lines 10) supplied by electron source 12 is focused to a diameter $a$ on a water-cooled x-ray target 14. In response to incident electrons, the target 14 emits x-rays which are represented by dashed lines 16. Illustratively, the x-rays so emitted are of the so-called soft type having characteristic wavelengths in the range 4–9 A. Among the suitable x-ray emissive materials from which the target 14 may be made are aluminum (K$\alpha$, $\lambda = 8.34$ A), silicon (K$\alpha$, $\lambda = 7.13$ A), molybdenum (L$\alpha$, $\lambda = 5.14$ A) and rhodium (L$\alpha$, $\lambda = 4.60$ A). To enhance the thermal-transfer properties and therefore the power handling capabilities of such materials, the target 14 may, for example, comprise a thin plating of a suitable target material on a copper substrate.

For characteristic x-rays it has been determined that the generation efficiencies of the above-specified target materials are about the same. Moreover, it has been observed that the ratio of characteristic-to-continuous x-rays increases with voltage. As specified later below, a high characteristic-to-continuous ratio is desired in an x-ray lithographic system.

The source 12 and the target 14 of the illustrative system shown in FIG. 1 are enclosed in a conventional high-vacuum compartment 18. X-rays emitted from the target 14 pass through an x-ray-transparent window 20 (made, for example, of beryllium) into a lower-vacuum working chamber 22 which contains a mask 24 and a resist-coated wafer 26 separated by a distance S. For a wafer of diameter D, the gap between the mask 24 and the wafer 26 leads to a line edge uncertainty on the surface of the wafer of $Sa/r$, where $r$ is the distance between the x-ray source and the mask 24. In addition, a so-called run-out of amount $SD/2r$ occurs at the edges of the wafer 26. (Run-out is defined as a nonuniform change in the relative location of features on two supposedly identical patterns.) The run-out is predictable and is fundamentally not serious if S is uniform over the entire wafer area. Moreover, diffraction effects can generally be neglected since for an x-ray wavelength of about 10 A, 0.25-$\mu$m lines can be resolved for mask-to-wafer spacings as large as about 60 $\mu$m.

Figure 2:
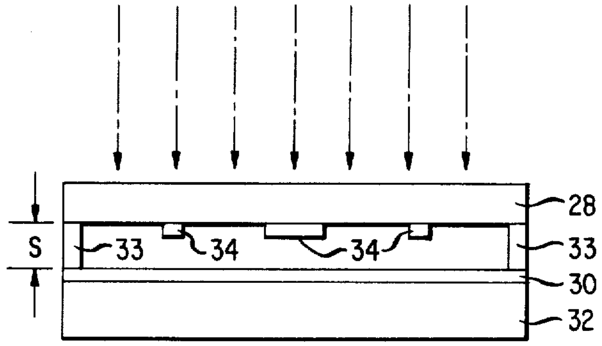
(PRIOR ART) FIG. 2
FIG. 2 is an enlarged pictorial representation of a conventional mask and associated resist-coated wafer of the type utilized in the FIG. 1 system.

FIG. 2 is a more detailed showing of the generalized mask and wafer depicted in FIG. 1. In FIG. 2 an x-ray-transparent mask substrate 28 is shown maintained apart a distance S from a polymer resist coating 30 disposed on the surface of a wafer 32. Illustratively, spacer members 33 are utilized to establish the desired distance between the substrate 28 and the coating 30. In FIG. 2 (and also in FIGS. 4 and 5 to be described later below) dashed line arrows represent x-rays incident on the top surface of the substrate.

Various materials are available for forming the mask substrate 28 of FIG. 2. Beryllium exhibits relatively low absorption to x-rays, which makes it a good candidate for fabricating x-ray windows (such as the element 20 shown in FIG. 1). But it has other disadvantageous characteristics that dictate against its use in a mask structure. For example, it is expensive, brittle, optically opaque, toxic and it has a relatively high thermal coefficient of expansion.

For some applications, silicon is a suitable x-ray-transmissive material for the mask substrate 28 of FIG. 2. Silicon members 2 $\mu$m thick and 1 inch in diameter have been fabricated. But silicon has a K absorption edge at 6.74 A, which limits its usefulness as a mask substrate to a system employing aluminum or silicon K$\alpha$ x-ray sources. Moreover, thin silicon is fragile and requires extremely careful handling. Also, it is only partially transparent to optical wavelengths, which complicates alignment and registration of a silicon substrate with respect to an associated wafer.

X-ray-absorptive elements 34 definitive of a prescribed pattern to be formed in the coating 30 are shown in FIG. 2. Gold or platinum are suitable materials from which to form the elements 34. The formation process for such elements may comprise, for example, standard electron beam lithographic techniques followed by conventional ion milling, as described in the article by E. G. Spencer and P. H. Schmidt, *Journal of Vacuum Science and Technology*, Vol. 8, pages 552–570, September/October 1971.

Irradiation by x-rays of the mask shown in FIG. 2 causes the radiation-sensitive coating 30 to be selectively exposed in accordance with the pattern defined by the absorptive elements 34. In the coating 30 areas shadowed by the elements 34 are not exposed to the incident x-rays. In the exposed areas of the coating 30 either polymer crosslinking or polymer chain scission occurs depending, respectively, on whether the resist coating 30 is of the negative or positive type. In the case of a negative resist a developing solvent is then utilized to remove the unexposed polymer, whereas in the case of a positive resist the exposed polymer is removed. Subsequently, in accordance with standard techniques known in the art, materials may be deposited directly on the surface of the wafer 32 in those regions where the coating 30 has been removed. Or if, for example, an oxide layer had been previously formed directly on the wafer 32 below the coating 30, those portions of the oxide layer from which the coating 30 has been removed can then be selectively treated by chemical techniques or by ion milling or in other ways known in the art.

Figure 3:
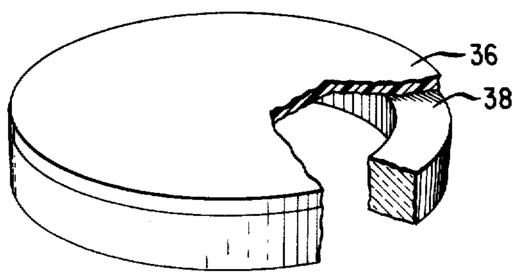
FIG. 3 shows a specific illustrative mask substrate made in accordance with the principles of the present invention.

FIG. 3 shows a portion of a specific illustrative mask structure made in accordance with the principles of the present invention. The depicted arrangement comprises a thin optically transparent sheet member 36 stretched over and bonded to a supporting element 38 which illustratively is formed in the shape of a ring.

Of the possible organic materials suitable for use as the sheet member 36 of FIG. 3, polyethylene terephthalate is particularly advantageous. Polyethylene terephthalate is, for example, commercially available in the form of Mylar film which exhibits an attractive combination of properties such as mechanical strength, low x-ray absorption, resistance to organic solvents, optical transparency, thermal stability, and ready availability in a variety of thicknesses with optical quality surfaces.

Other organic materials suitable for use as the sheet member 36 of FIG. 3 include mica and acetate.

The support member 38 is made of a strong, durable and dimensionally stable material such as a suitable metal, silicon or fused silica. One important consideration in selecting a material for the member 38 is to match the physical characteristics thereof to those of the wafer on whose surface a desired pattern is to be formed. As a result of such matching, ambient changes (in, for example, temperature and humidity) will cause the dimensions of the support member 38 and the associated wafer to change correspondingly in a tracking manner. In that way an initial registration established between the member 38 and its associated wafer will be maintained within close tolerances.

The support member 38 is shown in FIG. 3 as being formed in the shape of a ring. Although the ring shape has been found to be advantageous for some applications of practical interest, it is to be understood that the member 38 may be formed in any desired geometrical shape.

To be practical, an x-ray-transmissive mask substrate should transmit at least 50 percent of the x-rays incident thereon. Any greater absorption by the substrate (1) increases the required exposure time of the resist coating to an undesirable extent, and (2) reduces the characteristic-to-continuous x-ray ratio to a value that corresponds to a marginally low contrast ratio between exposed and unexposed portions of the resist coating.

It has been determined that the thicknesses of Mylar film that transmit 50 percent of the below-indicated characteristic x-rays are as follows: 5.3 $\mu$m for aluminum K$\alpha$, 8.4 $\mu$m for silicon K$\alpha$, 18 $\mu$m for molybdenum L$\alpha$, and 27 $\mu$m for rhodium L$\alpha$. In each case a thinner film would transmit more than 50 percent of the incident x-rays. Thus, for example, commercially available 8.7-$\mu$m-thick Mylar film is suitable for use as a mask substrate in conjunction with silicon, molybdenum and rhodium x-ray sources but has too little transmission (about 32 percent) for use with an aluminum source.

In accordance with the principles of the present invention, the following illustrative procedure is carried out to fabricate the structure shown in FIG. 3. On a planar working surface a sheet of Mylar film is smoothed flat. Then a support element such as the member 38 of FIG. 3 is bonded (for example, with an epoxy cement) to a flat section of the film. After trimming off any excess film, the composite structure shown in FIG. 3 is heat treated at about 150° C for approximately 3 hours. This causes the Mylar film to shrink and to be stretched uniformally on the support member 38. Strains introduced during manufacture of the film are thereby relieved and the film surface is left flat and free of wrinkles and imperfections.

The aforementioned fabrication process involves little practical difficulty or expense. The resulting taut substrate exhibits an optically flat surface which is transparent. Accordingly, optical registration and alignment are feasible when using the mask in conjunction with an associated resist-coated wafer. Moreover, the resulting substrate is extremely durable. Significantly, a Mylar film stretched in the manner described is as dimensionally stable as the material of the support member 38.

Figure 4:
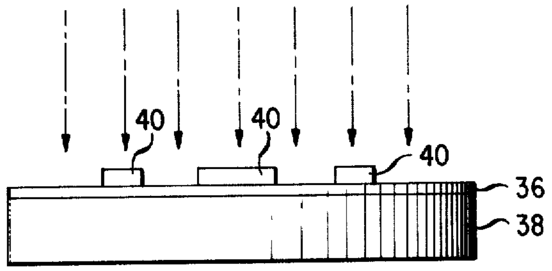
FIG. 4 depicts an x-ray-absorptive pattern deposited on the FIG. 3 substrate.

Next, by utilizing conventional techniques of electron beam lithography, followed, for example, by standard ion milling, an x-ray-absorptive pattern is formed on the top surface of the taut substrate 36 of FIG. 3. Such a pattern, represented by stripes 40 of, for example, 0.5-$\mu$m-thick gold, is depicted in FIG. 4. The resulting structure comprises an x-ray mask suitable for interposition between a source of x-rays and a resist-coated wafer on which a replica of the stripes 40 is to be formed.

Inadvertent scratches that develop in the x-ray absorptive stripes 40 of FIG. 4 may be reproduced on the surface of the wafer to be associated with the depicted mask structure. To protect the stripes from such damage as well as to impart additional rigidity to the mask structure, a hard transparent material with a relatively low x-ray-absorption characteristic may be deposited over the stripes 40. Such a layer covering the stripes will also prevent photoelectrons, that are ejected from the metal-absorptive pattern by the incident x-rays, from contributing to exposure of the x-ray resist.

In accordance with one specific illustrative aspect of the principles of the present invention, a 2-$\mu$m-thick layer of boron carbide is sputter deposited on the top surface of the taut substrate to protect the aforementioned stripes 40. Such a protective layer 42 is shown in the cross-sectional representation of FIG. 5. Any scratches that develop in the layer 42 are transparent to x-rays and will not be reproduced in an associated wafer.

Other materials suitable for forming the protective layer 42 include thin metallic films of, for example, aluminum or beryllium, optically transparent materials such as indium oxide, tin oxide and silicon oxide, as well as a variety of monomer and polymer plastic coatings.

In accordance with another specific illustrative aspect of the principles of this invention, a thin-film filter is added to the afore-described mask structure to enhance the characteristic-to-continuous x-ray-transmission properties thereof. Such a filter is designed to be relatively absorptive of a wide spectrum of x-rays except for a narrow band that includes the characteristic wavelength. Thus, for example, a 5-$\mu$m-thick film of poly (vinylidene chloride) poly (vinyl chloride) copolymer deposited on the herein-described mask substrate 36 is highly absorptive of 4 A and greater-wavelength x-rays incident thereon except for a narrow band that includes the aforementioned rhodium wavelength. (X-ray resists are relatively insensitive to x-rays less than 4 A in wavelength.) For any other x-ray source a corresponding thin-film filter material may be selected to pass the characteristic wavelength of the source but to absorb most of the incident x-ray energy at adjacent wavelengths.

Figure 5:
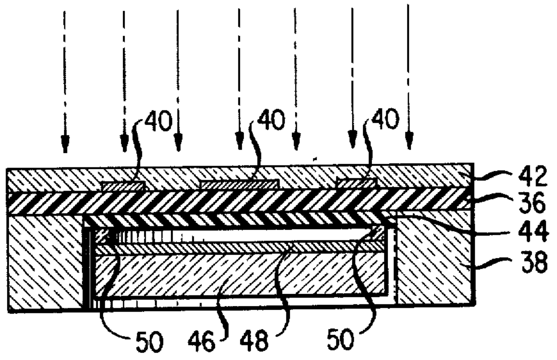
FIG. 5 is a cross-sectional showing of the FIG. 4 mask with the addition thereto of a protective layer and of a film that acts as a filter to enhance the characteristic-to-continuous x-ray-transmission property of the mask assembly.

In FIG. 5 such a thin-film filter 44 is shown as a layer deposited on the bottom surface of the taut substrate 36. Such positioning of the filter is illustrative only. If desired, the layer 44 may instead be deposited on the top surface of the protective layer 42. Or the layer 44 may be disposed directly over the stripes 40 to serve as the protective layer itself. Or the layer 44 may be disposed directly over the stripes 40 and then covered with the protective layer 42.

Also shown in FIG. 5 is a conventional wafer 46 made, for example, of silicon coated with a layer 48 of a suitable x-ray-resist material such as poly methyl methacrylate.

The top surface of the resist layer 48 may be aligned in contacting relationship with the bottom surface of the thin-film filter 44. Alternatively, as indicated in FIG. 5, spacer elements 50 may be utilized to establish a predetermined distance between the coated wafer and the aforespecified mask structure.

In the manner specified above, high-resolution patterns for MOS devices, high-frequency transistors, bubble devices and other components may be fabricated. Although the resolution of such patterns can of course be no greater than that of the pattern originally formed on the aforedescribed x-ray substrate, the replication of the original pattern on associated wafers is achieved in a simple and inexpensive way.

It is to be understood that the above-described arrangements are only illustrative of the application of the principles of the present invention. In accordance with these principles, numerous other arrangements may be devised by those skilled in the art without departing from the spirit and scope of the invention.

What is claimed is:

1. In combination in a mask structure, a dimensionally stable support member, an x-ray-transparent heat-treated film stretched over and bonded to said support member, and an x-ray-absorptive pattern disposed on said film.

2. In combination in a mask structure, a dimensionally stable support member, an x-ray-transparent film stretched over and bonded to said support member, and an x-ray-absorptive pattern disposed on said film, wherein said film is made of polyethylene terephthalate.

3. A combination as in claim 2 further including x-ray-transparent means for protecting said pattern from damage.

4. A combination as in claim 3 still further including a layer deposited on said film for absorbing all but a narrow preselected band of x-ray wavelengths.

5. A combination as in claim 4 wherein said x-ray-transparent means comprises a layer of boron carbide deposited on said film to cover said pattern.

6. A combination as in claim 5 wherein said pattern is made of gold.

7. A combination as in claim 6 wherein said support member is shaped in the form of a ring.

8. A method of fabricating an x-ray mask substrate comprising the steps of bonding peripheral portions of an x-ray-transparent film to a dimensionally stable support member, heat treating the film to impart a tautness thereto, and forming an x-ray-absorptive pattern on said taut film.

9. In combination in a mask structure, a dimensionally stable support member, an x-ray-transparent film stretched over and bonded to said support member, an x-ray-absorptive pattern disposed on said film, x-ray-transparent means for protecting said pattern from damage, and a layer deposited on said film for absorbing all but a narrow preselected band of x-ray wavelengths.

* * * * *